(12) United States Patent
Heinemann et al.

(10) Patent No.: US 7,019,981 B2
(45) Date of Patent: Mar. 28, 2006

(54) MAKING CONTACT WITH SEMICONDUCTOR CHIPS IN CHIP CARDS

(75) Inventors: Erik Heinemann, Regensburg (DE); Frank Pueschner, Kelheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/762,882

(22) Filed: Jan. 21, 2004

(65) Prior Publication Data

US 2004/0150962 A1  Aug. 5, 2004

Related U.S. Application Data

(63) Continuation of application No. PCT/DE02/02935, filed on Aug. 9, 2002.

(30) Foreign Application Priority Data

Aug. 10, 2001  (DE) ................... 101 39 395

(51) Int. Cl.
*H05K 1/14* (2006.01)

(52) U.S. Cl. ................ 361/737; 361/760; 361/720; 257/679; 174/255

(58) Field of Classification Search ............... 361/737, 361/758, 740–742, 760, 720; 257/679; 174/250, 174/255
See application file for complete search history.

(56) References Cited

U.S. PATENT DOCUMENTS 4,966,857 A  10/1990  Haghiri-Tehrani et al.
5,671,525 A * 9/1997 Fidalgo ........................ 29/600
5,888,624 A  3/1999  Haghiri et al.
6,031,724 A  2/2000  Takahashi
6,076,737 A * 6/2000 Gogami et al. ............. 235/492
6,491,229 B1 * 12/2002 Berney ........................ 235/492

FOREIGN PATENT DOCUMENTS

| DE | 35 35 791 C2 | 5/1986 |
|---|---|---|
| DE | 197 00 254 A1 | 6/1998 |
| DE | 198 28 653 A1 | 1/2000 |
| EP | 0 521 502 A1 | 1/1993 |
| FR | 2 786 009 A1 | 5/2000 |
| JP | 2-2092 A1 | 1/1990 |
| JP | 2-4596 A1 | 1/1990 |
| JP | 08063567 A1 | 3/1996 |
| RU | 2 143 741 C1 | 12/1999 |
| RU | 2 169 389 C2 | 6/2001 |

* cited by examiner

*Primary Examiner*—Kamand Cuneo
*Assistant Examiner*—Hung S. Bui
(74) *Attorney, Agent, or Firm*—Darby & Darby

(57) ABSTRACT

A chip card having a chip card body, a semiconductor chip and a carrier substrate, the carrier substrate being provided on both sides with surface contacts and with contact-hole lines electrically connecting the upper and lower surface contacts to one another. The contact-hole lines are arranged so close to the edge of the carrier substrate that their lower ends open out into a base of an outer cavity, where they are closed off, to thereby prevent moisture from penetrating into the inner cavity, in which the semiconductor chip is located, without it being necessary to produce a dedicated cover for the contact-hole lines.

20 Claims, 2 Drawing Sheets

MAKING CONTACT WITH SEMICONDUCTOR CHIPS IN CHIP CARDS

CROSS-REFERENCE TO RELATED APPLICATIONS

This application is a continuation of International Patent Application Serial No. PCT/DE02/02935, filed Aug. 9, 2002, which published in German on Feb. 27, 2003 as WO 03/017196.

FIELD OF THE INVENTION

The present invention is directed to a chip card, and more particularly to a chip card in which a semiconductor chip is shielded from pollutants and moisture.

BACKGROUND OF THE INVENTION

Chip cards essentially comprise a chip card body, generally a plastic card, which has a space for accommodating the semiconductor chip. This space usually comprises an outer, shallow cavity, in the base surface of which a further, inner cavity is recessed.

The inner cavity has a smaller cross-sectional area than the outer cavity, and consequently the outer cavity extends laterally beyond the inner cavity. The base surface of the outer cavity surrounds the inner cavity.

The inner cavity is used to accommodate the semiconductor chip in the chip card body. The carrier substrate, to which the semiconductor chip is electrically and mechanically connected, is arranged in the outer cavity. The electrical connections between the semiconductor chip and the surface contacts on the top side of the carrier substrate allow the card to be read and, depending on the chip card, allow information to be written to the semiconductor chip as a result of a chip card ATM making appropriate contact with the upper surface contacts.

The carrier substrate is secured to the base surface of the outer cavity and almost completely fills the outer cavity. At the same time, the carrier substrate covers the inner cavity, in which the semiconductor chip is located. Therefore, the semiconductor chip is protected from external influences by the carrier substrate.

There are known chip cards whose carrier substrates for this purpose have surface contacts on their top side, while bonding connections, for example bonding wires, which electrically connect the semiconductor chip to the surface contacts, are secured to the rear sides thereof. To enable the bonding wires to be connected to the rear sides of the surface contacts on the top side of the carrier substrate, the carrier substrate has an opening below each contact.

Furthermore, chip cards in which the carrier substrate also has surface contacts on its underside are known.

The surface contacts are electrically connected to the semiconductor chip and also to the surface contacts on the top side of the chip card. To electrically connect the upper and lower surface contacts to one another, contact-hole lines, known as vias, are produced in the carrier substrate. A via is a preferably cylindrical opening in the carrier substrate, which has a diameter of between 0.1 and 1 mm and extends from the underside to the top side of the carrier substrate, the upper end of the via or contact-hole line often being covered by the upper surface contacts. The cylindrical inner wall of the contact-hole lines is processed in such a way that it is electrically conductive on account of a corresponding metallic or other electrically conductive covering of the inner wall, the contact hole forms an electrical line which runs between in each case one upper and one lower surface contact of the carrier substrate.

The semiconductor chip is connected to the lower surface contacts of the carrier substrate by electrical connections and can therefore be electrically driven through the vias from the top side of the carrier substrate.

A semiconductor chip which is enclosed in a chip card has to be insulated from environmental influences, so that moisture or pollutants which are present in the ambient air do not diffuse into the semiconductor chip. To prevent the internal space formed by the second, inner cavity from coming into contact with the environment, the vias, which are openings which pass through the carrier substrate, may be arranged outside the basic area of the second cavity, on the base surface of the first cavity. Consequently, it is impossible for the ambient air to be exchanged with the air in the interior of the second cavity.

However, even as early as during the production process a microclimate which contains moisture and/or pollutants and in the long term have a harmful effect on the semiconductor chip may become enclosed within the second cavity. Damage to the semiconductor chip from this microclimate cannot be reliably avoided even by means of a paste which covers the top side, facing the cavity of substrate, of the integrated circuit. Pollutants which are present in the microclimate can diffuse through the paste or through interfaces between the paste and the semiconductor chip.

SUMMARY OF THE INVENTION

The present invention relates to a chip card comprising a chip card body having a first cavity and a second cavity, the second cavity being recessed into a base of the first cavity, so that the first cavity extends laterally beyond the second cavity and a base surface of the first cavity surrounds the second cavity. A carrier substrate is secured to the chip card body and arranged in the first cavity and having an upper surface contact for reading the chip card on its top side and a lower surface contact on its underside, which are electrically connected to one another by contact-hole lines, which run through the carrier substrate, the contact-hole lines passing through both the lower surface contacts and the upper surface contacts and being arranged in a region of the first cavity which extends laterally outside the second cavity, and the contact-hole lines being covered at the base of the first cavity. A semiconductor chip is connected to the lower surface contacts of the carrier substrate by electrical connections. A bonding layer, which extends from the base of the first cavity into an interior of the second cavity and covers a region of the semiconductor chip, secures the carrier substrate, on its underside, to the base surface of the first cavity.

A preferred embodiment of the present invention provides a chip card in which substantial shielding of the semiconductor chip from pollutants and moisture even with respect to the volume of air enclosed in the second cavity is achieved at low cost.

According to a preferred embodiment of the invention, this object may be achieved by the carrier substrate, on its underside, being secured to the base surface of the first cavity by a bonding layer which extends from the base of the first cavity into the interior of the second cavity and covers a region of the semiconductor chip.

According to a preferred embodiment of the invention, shielding with respect to most of the volume of air, which is enclosed in the second cavity is achieved by the fact that a bonding layer, which is provided in the chip card of the generic type for securing the carrier substrate to the chip card body, is also provided in the second cavity. The bonding layer is usually only arranged in the region of the base surface of the first cavity, outside the second cavity, and in the region of the second cavity has a cut-out, since the electrical contacts to the semiconductor chip are arranged there, at the level of the base surface of the first cavity. According to a preferred embodiment of the invention, there is provision for the bonding layer to extend from the base of the first cavity into the interior of the second cavity and to cover a region of the semiconductor chip. The same bonding layer which, in order to secure the carrier substrate, is customarily provided only at the base surface outside the second cavity, therefore, according to a preferred embodiment of the invention, at the same time within the second cavity covers the semiconductor chip on its underside and extends next to the side faces of the semiconductor chip all the way to the base surface of the first cavity, with the result that the air volume of the second cavity is divided in two. The bonding layer shields most of the air volume from the semiconductor chip, so that only a fraction of the moisture and/or pollutants which are present comes into contact with the semiconductor chip. This results in substantial shielding of the microclimate which is achieved without additional cost outlay. In particular, there is provision for the bonding layer to surround the semiconductor chip in the second cavity from below. Since the bonding layer encloses the semiconductor chip projecting above the underside of the carrier substrate, it represents an additional protective covering and therefore, this bonding layer is also referred to herein as a "protective covering layer."

A preferred embodiment provides for the semiconductor chip, in the region of its electrical connections to the lower surface contacts of the carrier substrate, to be covered by an electrically insulating or anisotropic conductive paste and for the bonding layer to cover a region of the semiconductor chip which is not covered by the paste. The volume of the inner cavity is climatically shielded on account of the inventive sealing, which takes place at the base surface of the outer cavity, of the volume of the inner cavity with respect to the spaces in the contact-hole lines and with respect to the external environment of the chip card. However, if high mechanical loads on the chip card body lead to leaks and consequently to moisture penetrating into the inner cavity, the paste protects the electrical connections between the semiconductor chip and the lower surface contacts from corrosion. For this purpose, it is also possible to use an anisotropic conductive paste or an anisotropic conductive adhesive.

If the contact-hole lines are arranged in a region of the first cavity which extends laterally outside the second cavity, the contact-hole lines open out into the base surface of the first cavity, where the contact-hole lines are automatically closed off on account of this position of the contact-hole lines, it is no longer necessary, in order to protect the semiconductor chip, to apply covers for the contact-hole lines, since these lines no longer lead into the interior of the second cavity. The chip card created in this way can be produced at low cost and protects the semiconductor chip from external climatic influences, so that a microclimate which is harmful to the semiconductor chip cannot be formed.

The contact-hole lines are preferably closed off by the bonding layer. In this case, the contact-hole lines end at the base of the bonding layer which has been applied to the first, outer cavity of the chip card body and holds the carrier substrate. The bonding layer, which covers the base surface of the outer cavity, covers the edge of the underside of the carrier substrate and as a result simultaneously covers the lower openings of the contact-hole lines arranged at the edge of the carrier substrate.

Alternatively, there is provision for the contact-hole lines to open out into recesses in the bonding layer and for the bonding layer to surround and seal spaces formed by the recesses. In this case, there are recesses in the bonding layer of the chip card body, arranged at the same lateral position as the contact-hole lines of the carrier substrate. The lower openings of the contact-hole lines do not come into direct contact with the bonding layer; instead, they are spaced apart from the base surface of the outer cavity of the chip card body by the thickness of the bonding layer. This may be advantageous if the surface of the lower surface contacts is slightly elevated on account of the production of the contact-hole lines, for example if the opening of the contact-hole line is surrounded by an annular elevation. Since the end of the contact-hole line opens out into a space, an elevation of this type does not come into direct contact with the base of the outer cavity and therefore does not prevent contact between the carrier substrate and the bonding layer.

It is preferable for the lower surface contacts of the carrier substrate to extend beyond the inner edge of the base surface of the first cavity, as far as over the semiconductor chip within the second cavity. In this case, the connections of the semiconductor chip may be contact pins which point vertically, i.e., perpendicular to the surface of the chip card body, as far as which, in the lateral direction, the contact surfaces on the underside of the carrier substrate extend. If the inner ends, arranged in the region of these contact pins, of the lower surface contacts are generously dimensioned, reliable contact is made with the semiconductor chip even in the event of a slight lateral offset.

According to a preferred embodiment, the semiconductor chip is bonded to the lower surface contacts of the carrier substrate using the flip-chip method. In the flip-chip method, the semiconductor chip is fitted into the chip card body connected to the carrier substrate having been rotated through 180°, i.e., upside down. In this case, the upper aide of the semiconductor chip, with which contact is not made, faces the base of the second, inner cavity and is protected by this base from the card underside, which is not provided with electrical contacts.

With regard to the material used for the bonding layer, preferred embodiments provide for the bonding layer to be formed from a material which only becomes adhesive at elevated temperature or from a cured liquid adhesive, preferably from cured cyanoacrylate. A bonding layer comprising a material which only becomes adhesive at elevated temperature has the advantage that in the cold, as yet unadhesive, state it is easy to stamp recesses into the bonding layer, into which recesses the lower ends of the contact-hole lines subsequently open out. By contrast, with a liquid adhesive, it is also possible for the interior of the contact-hole lines to be partially filled, so that a larger sealing area can be achieved.

The chip card which is designed in accordance with the invention is preferably a mobile radio card.

BRIEF DESCRIPTION OF THE DRAWINGS

The invention is described below with reference to FIGS. 1 and 2, in which.

DETAILED DESCRIPTION OF THE PREFERRED MODE OF THE INVENTION

Figure 1:
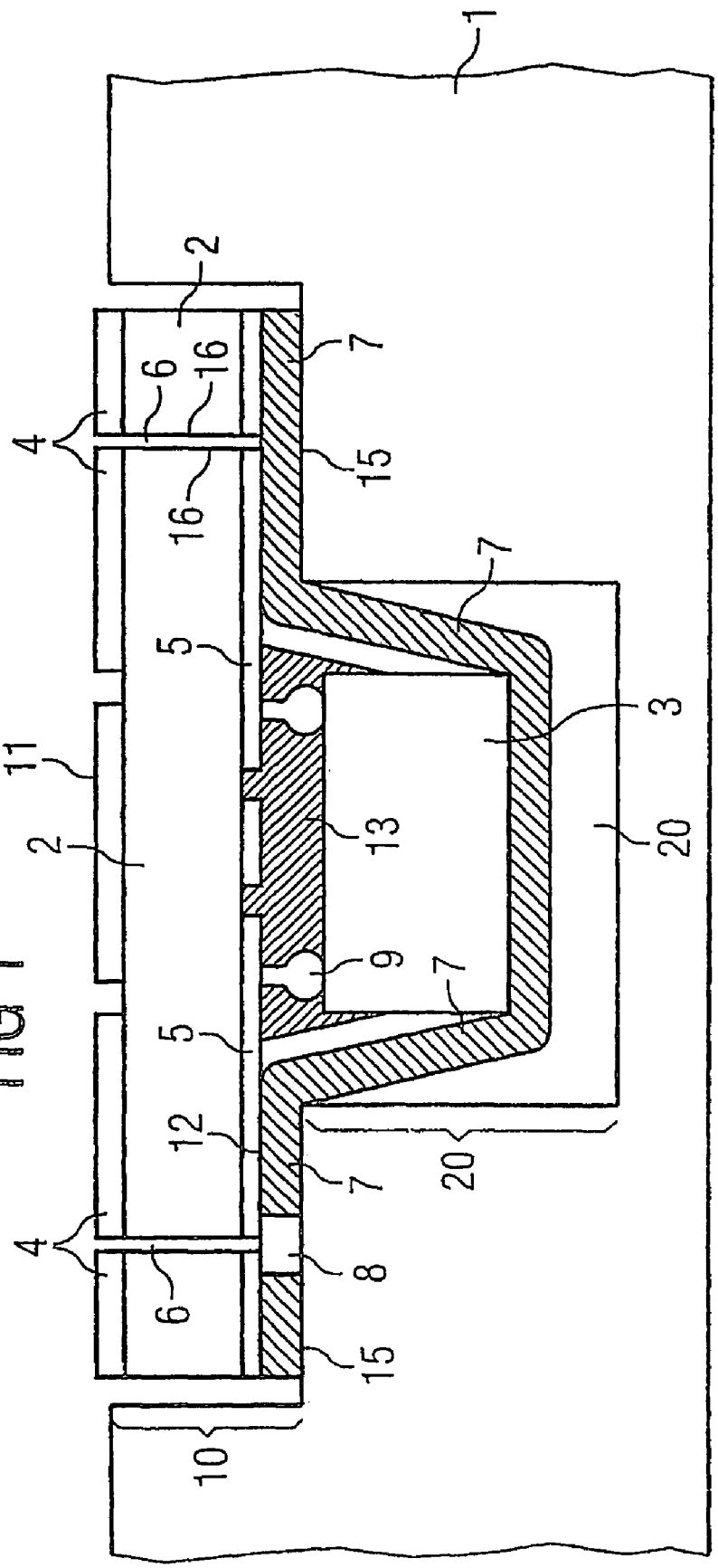
FIG. 1 shows a cross section through a chip card according to the invention.

FIG. 1 shows a chip card body 1, which may consist of a flexible or rigid plastic, in cross section, the thickness of the chip card corresponding to the height of the chip card body 1 illustrated in FIG. 1. The chip card body 1 has an outer cavity 10, which in the lateral direction, i.e., parallel to the chip card surface, has a larger cross section than a further cavity 20, which is recessed into the base 15 of the outer cavity. The outer cavity 10 extends laterally to the left and right and also upward and downward, perpendicular to the plane of the drawing, beyond the inner cavity 20, so that the base surface 15 surrounds the cross section of the inner cavity. In the outer cavity 10 there is a carrier substrate 2. In the inner cavity 20 there is a semiconductor chip 3, which is connected to the carrier substrate 2 by electrical connections 9. The carrier substrate 2 rests on the base surface 15 of the outer cavity 10 via a bonding layer 7 and in this way is secured to the chip card body 1. The carrier substrate 2 is used firstly to support the semiconductor chip 3 without direct contact with the chip card body 1, which may be flexible, and secondly to make electrical contact with the semiconductor chip 3 in order to read the chip card. For this purpose, a plurality of surface contacts 4 are arranged on the top side 11 of the carrier substrate 4. On its underside 12, the carrier substrate 2 has lower surface contacts 5, which have a different cross-sectional area from the upper surface contacts 4. The lower surface contacts 5 extend in particular further towards the centre of the carrier substrate than do the upper surface contacts 4. The carrier substrate 2 may, in the centre of the top side 11 and on the underside 12, have contact-like surfaces, known as islands, which are not themselves used to make contact with the semiconductor substrate. The semiconductor chip 3 is connected to the surface contacts 5 on the underside 12 of the carrier substrate 2 by electrical connections 9. The electrical connection between the lower surface contacts 5 and the surface contacts 4 on the top side 11 of the semiconductor chip, where contacts of an ATM card for reading the chip card are positioned, is produced by what are known as vias. As shown in FIG. 1, a via is a hole in the surface of a carrier substrate 2 which connects the top side 11 to the underside 12. In FIG. 1, a corresponding via 6 leads through upper surface contacts 4 and lower surface contacts 5. The via can pass through these contacts within their contact area or at the edge. The regions which are illustrated in FIG. 1, are denoted by 4 and 5 and are separated by vias 6, in each case show parts of the same surface contact, so that in total FIG. 1 shows in each case two upper surface contacts 4 and two lower surface contacts 5.

A via forms a hollow passage in the material of the carrier substrate 2, through which external air can penetrate into the interior of the chip card. The walls 16 of the vias 6 are processed in such a way that they are electrically conductive. They have a covering of an electrically conductive material which, like the wall, is shaped in the form of a hollow cylinder. On account of the conductive covering layer, the via represents a contact-hole line 6. The interior of the contact-hole line 6 is hollow and, if the contact-hole line 6 is not covered on at least one side of the carrier substrate 2, allows climatic exchange between ambient air and the volume in the interior of the card housing 2.

The contact-hole lines 6 do not necessarily have to lie completely within the cross-sectional area of a surface contact; they may likewise be arranged at the edge of a surface contact 4 or 5, for example at the edge of the carrier substrate 2.

The semiconductor chip 3 arranged in the inner cavity 20 is connected to the upper surface contacts 4 of the carrier substrate 2 by the electrical connections 9, the lower surface contacts 5 and the contact-hole lines. Since the upper surface contacts 4 extend to as far as over the inner cavity 20, the contact-hole lines 6 may be arranged within the cross-sectional area, i.e., in FIG. 1 within the width of the inner cavity 20. In this case, the lower surface contacts 5 would only have to bridge a short lateral distance between the contact-hole lines 6 and the electrical connections 9 of the semiconductor chip 3. In an arrangement of the contact-hole lines 6 of this type, external air could pass into the inner cavity 20, thus producing a microclimate which is harmful to the semiconductor chip 3. In particular moisture and pollutants which are present in the air can diffuse through the housing material 3 of the semiconductor chip and damage the latter if the contact-hole lines are not filled or covered.

Conventional chip cards with carrier substrates which are provided with surface contacts on both sides have what are known as blind vias, which are covered and closed off on the top side 11 of the carrier substrate 2 by surface contacts 4 applied after the contact-hole lines 6 have been formed. Therefore, these contact-hole lines only extend as far as the underside of the metallic surface contacts 4, i.e., only as far as just below the top side of the carrier substrate 2. Therefore, after the contact-hole lines have been produced, the upper contact surfaces 4 have to be applied, which makes production of the carrier substrate and therefore of the chip card more expensive.

According to the invention, the contact-hole lines 6 are arranged in the region of the outer cavity 10, which extends laterally outside the inner cavity 20, so that the contact hole-lines 6 open out into the base 15 of the outer cavity, where they are covered, laterally offset with respect to the inner cavity 2, without dedicated additional means being required for this purpose. In this way, the chip card according to the invention protects the semiconductor chip 3 from a damaging microclimate and, moreover, can be produced at low cost.

At their lower ends, the contact-hole lines 6 can be closed off in various ways. FIG. 1 illustrates two preferred embodiments in this respect. The via 6 illustrated on the right-hand aide of FIG. 1 is closed off by the bonding layer 7, by means of which the carrier substrate 2 is secured to the base 15 of the outer cavity 10 at the chip card body 1. The via 6 illustrated on the left-hand side of FIG. 1 is, according to an alternative embodiment, surrounded by a recess 8 in the bonding layer 7. The bonding layer 7 surrounds the space formed by the recess 8 in the plane of the base surface 15 of the outer cavity 10 from all sides and seals the space on all sides in this plane. Therefore, external air which has passed into the space 8 through the via 6 cannot penetrate into the region of the inner cavity 20. The semiconductor chip 3 is connected to the lower surface contacts 5 of the carrier substrate 2 by electrical connections 9. The connections 9 (bumps) mounted on the semiconductor chip 3 may be bonded to the contacts 5 or, if a paste 13 is applied to the contacts 5 as illustrated, may also be electrically connected to these contacts as a result of the semiconductor chip 3 being pressed onto the carrier substrate 2 until the paste 13 has solidified and holds the chip contacts 9 securely and permanently on the surface contacts 5. The paste 13, before the semiconductor chip 3 is pressed on, may already have been applied to the surface contacts 5, in which case the immersed contacts 9 are pressed through the paste 13.

The semiconductor chip 3 which is secured using the flip chip method, i.e., upside down on the carrier substrate 2, and the substrate 2 together form the module of the chip card. The carrier substrate 2 is preferably a flexible printed circuit which comprises a base material, to both sides 11, 12 of which surface contacts 4, 5 are applied. The contact-hole lines 6 pass all the way through the multilayer substrate formed from the base material and the surface contacts on both sides, so that the carrier substrate 2 itself cannot prevent moisture from penetrating into the inner cavity 20 and therefore cannot prevent chips from failing.

The layer 7, which may consist, for example, of a polymer (hot melt), which becomes adhesive at high temperatures, is used to secure the card module 2, 3 to the chip card body 1. It is also possible to use a liquid hot melt adhesive or alternatively fast-curing polymers, such as for example cyanoacrylate.

According to the invention, the bonding layer 7 is illustrated in continuous form in FIG. 1, i.e., it also extends into the inner cavity 20, where it surrounds the semiconductor chip 3 from below. This provides the chip 3 with additional protection, with the result that the semiconductor chip is shielded from a large proportion of the volume of air which is present in the second cavity. Therefore, a harmful microclimate can only act on the semiconductor chip to a significantly lesser extent than in a conventional chip card. Moreover, the shielding achieved is produced at low cost.

Figure 2:
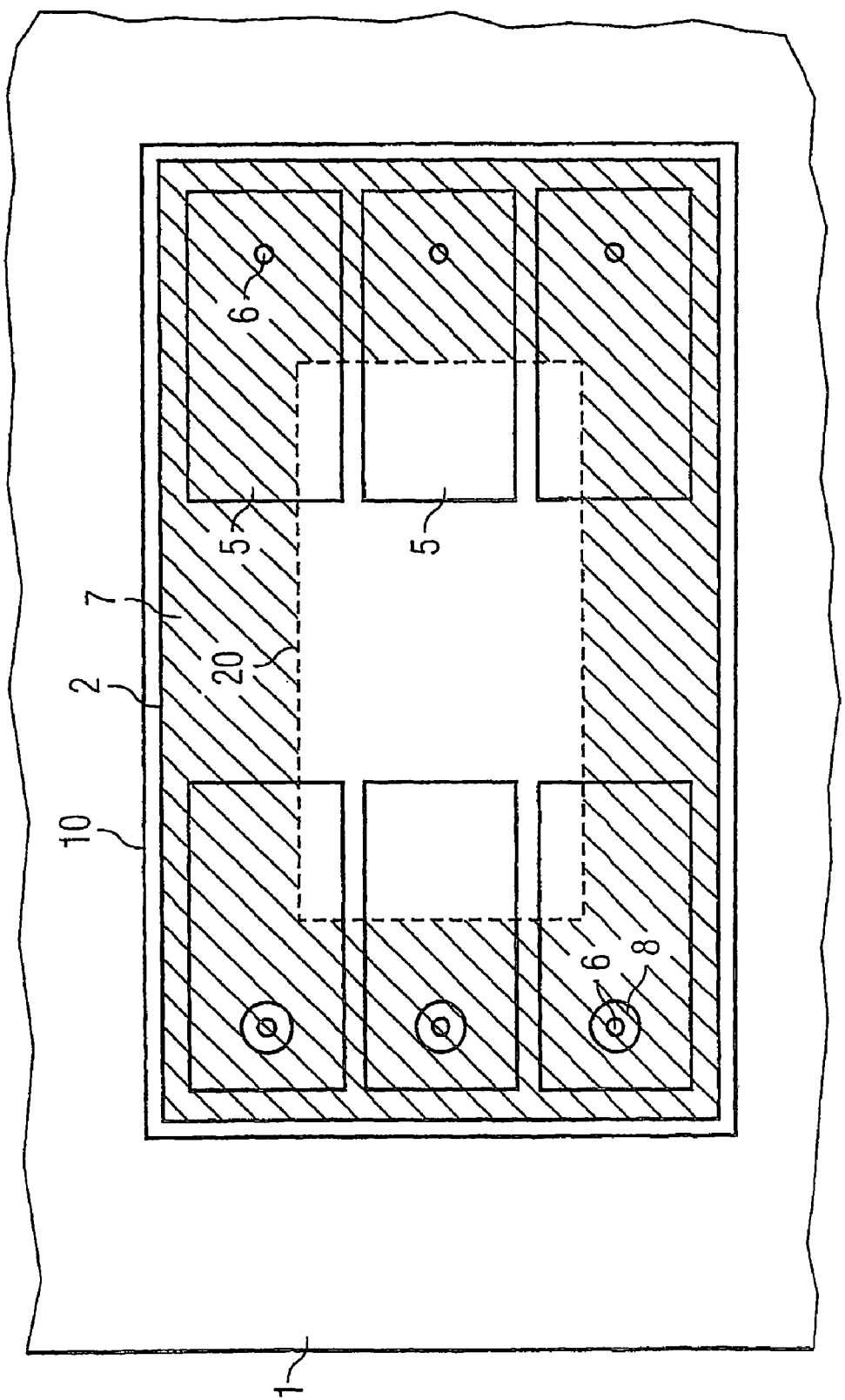
FIG. 2 shows a plan view of part of the top side of a chip card according to the invention.

FIG. 2 shows a diagrammatic representation of part of a chip card according to the invention, In an outer cavity 10 located at the chip card body 1 there is an inner cavity 20 which passes still further into the depth of the chip card body 1 and in which the semiconductor chip 3 is located. The carrier substrate 2 is arranged in the upper cavity 10, which extends laterally beyond the inner cavity 20. The bonding layer 7, which is illustrated in hatched form and is located only in those regions of the outer cavity 10 which are located laterally outside the cross section of the inner cavity 20 (which is marked by dashed lines), is arranged between the underside of the carrier substrate 2 and the base of the outer cavity 10.

Three contact-hole lines 6, which are illustrated on the right-hand side of the carrier substrate 2 in FIG. 2, open out into this bonding layer and are closed off thereby. In an alternatively embodiment, the contact-hole lines 6 may open out into recesses 8 in the bonding layer 7; in this case too, complete sealing is achieved, since in the plane of the base surface of the first cavity 10 the bonding layer 7 surrounds the recess 8 from all sides and seals it on all sides. Furthermore, the bonding layer 7, like the base surface of the first, outer cavity 10, surrounds the inner cavity 20 from all sides, thus preventing climatic exchange of ambient air.

While the invention has been described in detail with particular reference to certain embodiments thereof, the invention is capable of other and different embodiments, and its details are capable of modifications in various obvious respects. As would be readily apparent to those skilled in the art, variations and modifications can be affected while remaining within the spirit and scope of the invention. Accordingly, the foregoing disclosure, description, and drawing figures are for illustrative purposes only, and do not in any way limit the invention, which is defined only by the claims.

What is claimed is:

1. A chip card comprising:
a chip card body having a first cavity and a second cavity, the second cavity being recessed into a base of the first cavity, so that the first cavity extends laterally beyond the second cavity and a base surface of the first cavity surrounds the second cavity;
a carrier substrate secured to the chip card body and arranged in the first cavity and having an upper surface contact for reading the chip card on its top side and a lower surface contact on its underside, which are electrically connected to one another by contact-hole lines, which run through the carrier substrate, the contact-hole lines passing through both the lower surface contacts and the upper surface contacts and being arranged in a region of the first cavity which extends laterally outside the second cavity, and the contact-hole lines being covered at the base of the first cavity;
a semiconductor chip connected to the lower surface contacts of the carrier substrate by electrical connections; and
a protective covering layer, which extends from the base of the first cavity into an interior of the second cavity and covers a region of the semiconductor chip, securing the carrier substrate, on its underside, to the base surface of the first cavity;
wherein the second cavity encloses a volume of air and wherein the protective covering layer shields the semiconductor chip from at least most of the volume of air.

2. The chip card of claim 1, wherein the protective covering layer surrounds the semiconductor chip in the second cavity from below.

3. The chip card of claim 1, further comprising an electrically insulating or anisotropic conductive paste covering the semiconductor chip in a region of the electrical connections to the lower surface contacts of the carrier substrate, and not covering a region of the semiconductor chip which is not covered by the paste.

4. The chip card of claim 1, wherein the protective covering layer covers the contact-hole lines.

5. The chip card of claim 1, further comprising recesses formed by the protective covering layer and surrounding the contact-hole lines, wherein the protective covering layer surrounds and seals spaces formed by the recesses.

6. The chip card of claim 1, wherein the lower surface contact of the carrier substrate extends beyond an inner edge of a base surface of the first cavity and above the semiconductor chip within the second cavity.

7. The chip card of claim 1, wherein the semiconductor chip is bonded to the lower surface contacts of the carrier substrate using a flip-chip method.

8. The chip card of claim 1, wherein the protective covering layer is formed from a material which only becomes adhesive at an elevated temperature.

9. The chip card of claim 1, wherein the protective covering layer is formed from a cured liquid adhesive.

10. The chip card of claim 9, wherein the protective covering layer is formed from cured cyanoacrylate.

11. The chip card of claim 1, wherein the chip card is a mobile radio card.

12. A chip card comprising:
a chip card body having a first cavity and a second cavity, the second cavity being recessed into a base of the first cavity, so that the first cavity extends laterally beyond the second cavity and a base surface of the first cavity surrounds the second cavity;
a semiconductor chip provided in the second cavity;

a carrier substrate provided in the first cavity and having upper and lower surface contacts;

a contact-hole line electrically connecting the upper and lower surface contacts of the carrier substrate and arranged in a region of the first cavity which extends laterally outside the second cavity; and a protective covering layer extending from the base of the first cavity into an interior of the second cavity, closing a lower end of the contact-hole line, and covering a region of the semiconductor chip;

wherein the second cavity encloses a volume of air and wherein the protective covering layer shields the semiconductor chip from at least most of the volume of air.

13. The chip card of claim 12, wherein the protective covering layer surrounds the semiconductor chip in the second cavity from below.

14. The chip card of claim 12, further comprising a recess formed by the protective covering layer and surrounding the contact-hole line, wherein the bonding layer surrounds and seals a space formed by the recess.

15. The chip card of claim 12, wherein the lower surface contact of the carrier substrate extends beyond an inner edge of a base surface of the first cavity and above the semiconductor chip within the second cavity.

16. The chip card of claim 12, wherein the semiconductor chip is bonded to the lower surface contact of the carrier substrate using a flip-chip method.

17. The chip card of claim 12, wherein the protective covering layer is formed from a material which only becomes adhesive at an elevated temperature.

18. The chip card of claim 12, wherein the protective covering layer is formed from a cured liquid adhesive.

19. The chip card of claim 18, wherein the protective covering layer is formed from cured cyanoacrylate.

20. The chip card of claim 12, wherein the chip card is a mobile radio card.

* * * * *